(12) United States Patent
Baik et al.

(10) Patent No.: US 12,409,755 B2
(45) Date of Patent: Sep. 9, 2025

(54) SYSTEM FOR DIAGNOSING BATTERY CELL PROVIDED IN ELECTRIC VEHICLE

(71) Applicants: AIRPOINT CO., LTD., Daejeon (KR); Cell Point Co., LTD., Daejeon (KR)

(72) Inventors: Sung Jun Baik, Daejeon (KR); Jun Ho Cho, Daejeon (KR)

(73) Assignees: AIRPOINT CO., LTD., Daejeon (KR); Cell Point CO., LTD., Daejeon (KR)

( * ) Notice: Subject to any disclaimer, the term of this patent is extended or adjusted under 35 U.S.C. 154(b) by 185 days.

(21) Appl. No.: 18/332,881

(22) Filed: Jun. 12, 2023

(65) Prior Publication Data
US 2024/0336159 A1 Oct. 10, 2024

(30) Foreign Application Priority Data
Apr. 6, 2023 (KR) .................. 10-2023-0045087

(51) Int. Cl.
*B60L 58/16* (2019.01)
*G01R 31/3842* (2019.01)
*G01R 31/392* (2019.01)
*H01M 10/42* (2006.01)

(52) U.S. Cl.
CPC .......... *B60L 58/16* (2019.02); *G01R 31/3842* (2019.01); *G01R 31/392* (2019.01);
(Continued)

(58) Field of Classification Search
CPC ..... B60L 58/16; B60L 58/10; G01R 31/3842; G01R 31/392; G01R 31/396;
(Continued)

(56) References Cited

U.S. PATENT DOCUMENTS

| | | | |
|---|---|---|---|
| 2013/0308679 A1* | 11/2013 | Choi | H01M 10/425 374/152 |
| 2014/0117939 A1* | 5/2014 | Lim | H01M 10/482 320/134 |

(Continued)

FOREIGN PATENT DOCUMENTS

| | | |
|---|---|---|
| CN | 113690958 | 11/2021 |
| KR | 10-2080632 | 5/2015 |

(Continued)

OTHER PUBLICATIONS

Office Action for Korea Patent Application No. 10-2023-0045087, mailed Nov. 22, 2024.

(Continued)

*Primary Examiner* — Thomas Ingram

(57) ABSTRACT

A system for diagnosing a battery cell using a substrate manufactured by an LDCMOS process, includes a master BMS and a plurality of direct BMSs, wherein a battery cell connection unit included in each direct BMS makes direct contact with a positive electrode terminal and a negative electrode terminal of each of a plurality of battery cells of a battery module to measure raw data of voltages of the plurality of battery cells and raw data of a current of the battery module, and in order to accurately process raw data of the voltages of the plurality of battery cells and raw data of the currents, a first substrate unit manufactured by the LDCMOS process and a second substrate unit including a configuration to wirelessly transmit and receive a signal generated and processed by the first substrate unit to and from the master BMS are provided.

5 Claims, 11 Drawing Sheets

(52) U.S. Cl.
CPC .. *H01M 10/425* (2013.01); *H01M 2010/4278* (2013.01); *H01M 2220/20* (2013.01)

(58) Field of Classification Search
CPC ...... G01R 31/367; G01R 19/10; G01R 19/25; G01R 31/371; G01R 31/385; H01M 10/425; H01M 2010/4278; H01M 2220/20; H01M 10/486; G05F 1/46; G08C 17/02; H02J 7/00309

See application file for complete search history.

(56) References Cited

U.S. PATENT DOCUMENTS

| | | | | |
|---|---|---|---|---|
| 2016/0105042 | A1* | 4/2016 | Taylor | H01M 10/482 |
| | | | | 320/134 |
| 2016/0156204 | A1* | 6/2016 | Kim | H02J 7/00304 |
| | | | | 320/134 |
| 2016/0226263 | A1* | 8/2016 | Seo | H02J 7/005 |
| 2016/0294019 | A1* | 10/2016 | Yamauchi | H01M 10/48 |
| 2019/0319472 | A1* | 10/2019 | Lebreux | H02J 7/00309 |
| 2020/0059106 | A1* | 2/2020 | Karlsson | H01M 10/425 |
| 2020/0412146 | A1* | 12/2020 | Takechi | H02J 7/005 |

FOREIGN PATENT DOCUMENTS

| | | |
|---|---|---|
| KR | 10-2019-0092088 | 8/2019 |
| KR | 10-2020-0127638 | 11/2020 |
| KR | 10-2022-0129735 | 9/2022 |

OTHER PUBLICATIONS

Notice of Allowance for Korea Patent Application No. 10-2023-0045087, mailed Feb. 10, 2025.

* cited by examiner

SYSTEM FOR DIAGNOSING BATTERY CELL PROVIDED IN ELECTRIC VEHICLE

BACKGROUND OF THE INVENTION

1. Field of the Invention

The present invention relates to a system for diagnosing a battery cell provided in an electric vehicle, and more specifically, to a system for diagnosing a battery cell provided in an electric vehicle, in which the system includes a master BMS and a plurality of direct BMSs, wherein a battery cell connection unit included in each of the direct BMSs comes into direct contact with a positive electrode terminal and a negative electrode terminal of each of a plurality of battery cells included in a battery module to measure raw data of a voltage of each of the battery cells and raw data of a current of the battery module, a first substrate unit which generates information about a voltage, current, and temperature for the plurality of battery cells; and a second substrate unit that converts an analog electrical signal, which is generated by the first substrate unit, into a digital signal to wirelessly transmit the digital signal to the master BMS are provided, and the first substrate unit and the second substrate unit are implemented by different processes and provided in one semiconductor chip.

2. Description of the Related Art

Recently, environmental regulations for vehicles having internal combustion engines have been gradually severe all over the world, and accordingly, demands for vehicles, such as electric vehicles (EVs) or hybrid vehicles (MHEVs, PHEVs and FHEVs), using battery power as motive power have increased. As a result, automotive companies around the world have been increasingly interested in battery management technologies for improving efficiency, performance and durability of batteries, and researches and developments related to the technologies are being actively conducted in various companies and research organizations.

Particularly, a voltage, a current, and a temperature are the most important indicators among various indicators capable of determining a condition of a battery installed in a vehicle. A battery management system (BMS) for managing and controlling the battery can determine the state of the battery by measuring the voltage, current, temperature and the like of the battery installed in the vehicle. In general, the BMS includes: a plurality of slave BMS for managing at least one battery module; and a master BMS for controlling the slave BMSs.

Meanwhile, conventional technologies related to battery management systems include a technology of estimating a state of a battery provided in an electric vehicle by measuring a voltage and a current of the entire battery pack as illustrated in [FIG. 1] of Korean Registered Patent No. 10-2080632. However, as in the conventional technologies, when only information about the entire battery pack is derived, and accurate information about each of the plurality of battery cells included in the battery pack is not derived, voltage imbalance between the individual cells may not be determined at an early stage, and thus the entire battery pack may have to be replaced. In this case, the burden of costs imposed on consumers may increase.

Therefore, in order to solve the above-described problems, a battery management system technology is required to diagnose the exact state of each of the battery cells at an early stage by deriving information about a voltage, current, and temperature of each of the plurality of battery cells so that the performance of the battery provided in the electric vehicle may be safely maintained for a longer period of time.

RELATED ART DOCUMENT

[Patent Document]
(Patent Document 0001) Korean Registered Patent No. 10-2080632 (published on Feb. 18, 2020)

SUMMARY OF THE INVENTION

An object of the present invention relates to a system for diagnosing a battery cell provided in an electric vehicle, and more specifically, to a system for diagnosing a battery cell provided in an electric vehicle, in which the system includes a master BMS and a plurality of direct BMSs, wherein a battery cell connection unit included in each of the direct BMSs comes into direct contact with a positive electrode terminal and a negative electrode terminal of each of a plurality of battery cells included in a battery module to measure raw data of a voltage of each of the battery cells and raw data of a current of the battery module, a first substrate unit which generates information about a voltage, a current, and a temperature for the plurality of battery cells; and a second substrate unit that converts an analog electrical signal, which is generated by the first substrate unit, into a digital signal to wirelessly transmit the digital signal to the master BMS are provided, and the first substrate unit and the second substrate unit are implemented by different processes and provided in one semiconductor chip.

In order to solve the above problem, one embodiment of the present invention provides a system for diagnosing a battery cell located inside a vehicle, including: a plurality of direct BMSs located inside the vehicle and electrically connected to a plurality of battery cells included in a battery module; and a master BMS located inside the vehicle and configured to wirelessly communicate with the direct BMSs, wherein the direct BMS includes: a first substrate unit; and a second substrate unit, the first substrate unit includes: a battery cell connection unit including a plurality of ports that physically and electrically come into direct contact with an exposed electrode of each of the plurality of battery cells; a multiplexer (MUX) unit configured to receive analog voltage signals of the plurality of ports of the battery cell connection unit and sequentially output any one of the analogue voltage signals; a voltage dropping unit configured to drop the analog voltage signal output from the MUX unit; a current measurement unit configured to measure a current for all of the plurality of battery cells to generate an analog current signal; a temperature measurement unit configured to generate an analog temperature signal; and a first substrate connection unit configured to receive the analog voltage signal, the analog current signal, and the analog temperature signal to output the analog voltage signal, the analog current signal, and the analog temperature signal to the second substrate unit, and the second substrate unit converts the received analog voltage signal, analog current signal, and analog temperature signal into digital signals to wirelessly transmit the digital signals to the master BMS.

In one embodiment of the present invention, both a positive electrode terminal and a negative electrode terminal of each of the plurality of battery cells may come into direct contact with the ports included in the battery cell connection unit, and the voltage measurement unit may be connected to each port to measure a voltage for each of the battery cells.

In one embodiment of the present invention, the first substrate unit may include a substrate and an element which are manufactured by an LDCMOS process and operable in a first power range of 36 V or less, and includes a level shifter which lowers a voltage to a predetermined level or less by receiving power of all of the plurality of battery cells, the second substrate unit may include a substrate and an element which are operable in a second power range of 5 V or less, the level shifter transmits the power, which is lowered to the predetermined level or less, to a signal transmission unit and a regulator of the first substrate unit, and the first substrate unit and the second substrate unit may be stacked on a single semiconductor chip by an MCP process.

In one embodiment of the present invention, the battery cell connection unit may include a current measurement port including a resistor, and the current measurement unit may measure a current of the battery module based on a result of amplifying a voltage difference between both ends of the resistor, and an amplifier for amplifying the voltage difference may adjust an amplification rate by an automatic gain control unit.

In one embodiment of the present invention, the second substrate unit may include: an MCU; a first wireless communication unit connected to the MCU to wirelessly communicate with the master BMS; and a power supply unit configured to supply power to an element inside the second substrate unit by receiving power from the first substrate unit while lowering a voltage of power of the plurality of battery cells.

In one embodiment of the present invention, the first wireless communication unit may include: a modem unit including a modem transmission unit configured to perform modulation for transmitting information received from the MCU to the master BMS, and a modem reception unit configured to perform demodulation for transmitting the signal received from the master BMS to the MCU; and a transceiver unit including a Tx unit including a configuration to broadcast the signal modulated by the modem transmission unit through a first antenna unit, and an Rx unit including a configuration to process the signal received through the first antenna unit.

According to one embodiment of the present invention, the current of the battery module may be measured through the current measurement port that is directly connected to the battery module, and the current for each battery module may be measured in the battery pack including the plurality of battery modules, thereby deriving more accurate battery diagnosis information.

According to one embodiment of the present invention, the direct BMS is configured to physically and electrically come into direct contact with the battery cells, thereby measuring the voltage and the current for the battery cells, so that noise generated due to channel switching can be prevented in the related art in which the battery and the direct BMS are indirectly connected through a cable or the like, and accordingly, the reliability of data measured for the battery cells can be increased.

According to one embodiment of the present invention, the system is designed based on of individual cells and power to be supplied when a state of the battery is sensed, and the system may thus be operated at a relatively low voltage, thereby using a substrate implemented by the LDCMOS process rather than the conventional BCD process, and accordingly, it is possible to improve sensing accuracy for a battery.

According to one embodiment of the present invention, a configuration is adopted in which the first substrate unit which may measure the voltage, current, and temperature for the plurality of battery cells and is implemented by the LDCMOS process, and the second substrate unit which may wirelessly transmit information measured by the first substrate unit to the master BMS are implemented by different processes, and the first substrate unit and the second substrate unit are combined into one system semiconductor through an MCP method, so that it is possible to reduce manufacturing costs.

According to one embodiment of the present invention, the ADC is included in the second substrate unit, not the first substrate unit implemented by the LDCMOS process, so that it is possible to maximize performance thereof while minimizing the size of the ADC.

According to one embodiment of the present invention, the battery module and the direct BMS are physically directly connected without a separate component such as a cable, so that durability against vibration can be improved compared to the conventional vehicle battery management systems, and accordingly, reliability of measured data can be increased even in the special measurement situations such as high-speed driving environments.

According to one embodiment of the present invention, any type of relay BMS that relays or collects information about a plurality of battery cells connected to each of the plurality of direct BMSs between the master BMS and the plurality of direct BMSs and transmits the information to the master BMS, may not be required.

DETAILED DESCRIPTION OF THE INVENTION

Hereinafter, various embodiments and/or aspects will be disclosed with reference to the drawings. In the following description, multiple concrete details will be disclosed in order to help general understanding of one or more aspects for the purpose of description. However, it will be recognized by those skilled in the art that the aspect(s) can be executed without the concrete details. In the following description and accompanying drawings, specific exemplary aspects of one or more aspects will be described in detail. However, the aspects are exemplary, and some equivalents of various aspects may be used, and the descriptions herein are intended to include both the aspects and equivalents thereto.

In addition, various aspects and features will be presented by a system that may include multiple devices, components, and/or modules, etc. It should also be understood and appreciated that various systems may include additional devices, components, and/or modules, etc., and/or may not include all of the devices, components, modules, etc. discussed in connection with the drawings.

It is not intended that any "embodiment", "example", "aspect", "illustration", and the like used in the specification is preferable or advantageous over any other "embodiment", "example", "aspect", "illustration", and the like. The terms "unit", "component", "module", "system", "interface", and the like used below generally means a computer-related entity, and may mean, for example, hardware, a combination of hardware and software, and software.

Further, the terms "includes" and/or "including" mean that a corresponding feature/or component exists, but it should be appreciated that the terms "include" or "including" mean that presence or addition of one or more other features, components, and/or a group thereof is not excluded.

Further, terms including an ordinal number such as "first" or "second' may be used for the names of various components, not limiting the components. These expressions are used to distinguish one component from another component. For example, a first component may be referred to as a second component and vice versa without departing the scope of the present invention. The term "and/or" includes a combination of a plurality of related enumerated items or any of the plurality of related enumerated items.

In addition, unless otherwise defined, all terms used in embodiments of the present invention, including technical or scientific terms, have the same meaning as commonly understood by one of ordinary skill in the art to which the present invention belongs. Terms such as those defined in commonly used dictionaries should be interpreted as having a meaning consistent with the contextual meaning of the related art and should not be interpreted as either ideal or overly formal in meaning unless explicitly defined in the embodiments of the present invention.

Figure 1:
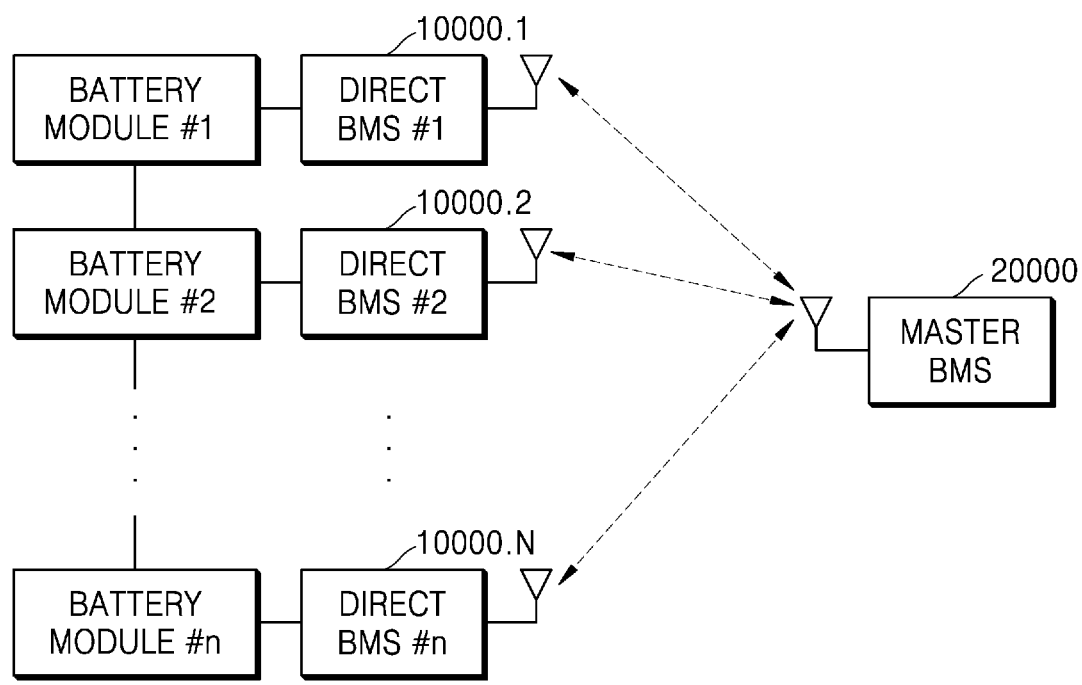
FIG. 1 schematically illustrates a configuration of a system for diagnosing a battery cell according to one embodiment of the present invention.

FIG. 1 schematically illustrates a configuration of a system for diagnosing a battery cell according to one embodiment of the present invention.

Specifically, the system for diagnosing a battery cell of the present invention senses a plurality of information about a battery provided in a vehicle using electric power of the battery as power, and diagnoses the battery based on the sensed information. As illustrated in FIG. 1, the diagnosis system includes a plurality of direct BMSs 10000.1 to 10000.N (hereinafter, 10000) and a master BMS 20000, and the master BMS 20000 wirelessly communicates with each of the plurality of direct BMSs 10000. That is, in FIG. 1, a solid line represents portions that are physically connected or comes into contact with each other, and a dotted line represents configurations that are wirelessly connected to each other.

The diagnosis system may be electrically connected to a battery located inside the vehicle to measure a plurality of indices for managing the battery. The plurality of indices include a voltage, a current, and a temperature. Further, the battery, which will be described later, is connected to the diagnosis system of the present invention and has a configuration including a battery module including a plurality of battery cells and a battery pack including a plurality of battery modules according to a known technology, but the present invention is not limited thereto and may be applied through a simple design change as long as the battery includes a plurality of battery cells.

More specifically, each of the plurality of direct BMSs 10000 may be electrically connected to the plurality of battery cells to measure a voltage, a current, and a temperature of the plurality of connected battery cells. As illustrated in FIG. 1, in one embodiment of the present invention, each of a plurality of direct BMSs 10000 is electrically connected to one battery module. Meanwhile, in another embodiment of the present invention, the unit of the plurality of battery cells connected to each of the plurality of direct BMSs 10000 is not limited to a battery module, and the unit may be set as a battery cell group including a predetermined number of battery cells.

Hereinafter, the diagnosis system will be described based on a configuration in which the plurality of direct BMSs 10000 are connected to the plurality of battery modules, respectively, and it is preferable that the number of the plurality of direct BMSs 10000 included in the diagnosis system of the present invention corresponds to the number of battery modules included in the battery.

Information sensed by each of the plurality of direct BMSs 10000 from the battery module connected thereto is transmitted to the master BMS 20000 through a first wireless communication unit 2200 (see FIG. 2) and a first antenna unit 2300 (see FIG. 2) included in each of the plurality of direct BMSs 10000, and the master BMS 20000 diagnoses a state of the battery based on the information received from each of the plurality of direct BMSs 10000. Hereinafter, a hardware configuration of the system for diagnosing a battery cell of the present invention and a configuration in which the direct BMS 10000 communicates with the master BMS 20000 will be described in detail.

Figure 2:
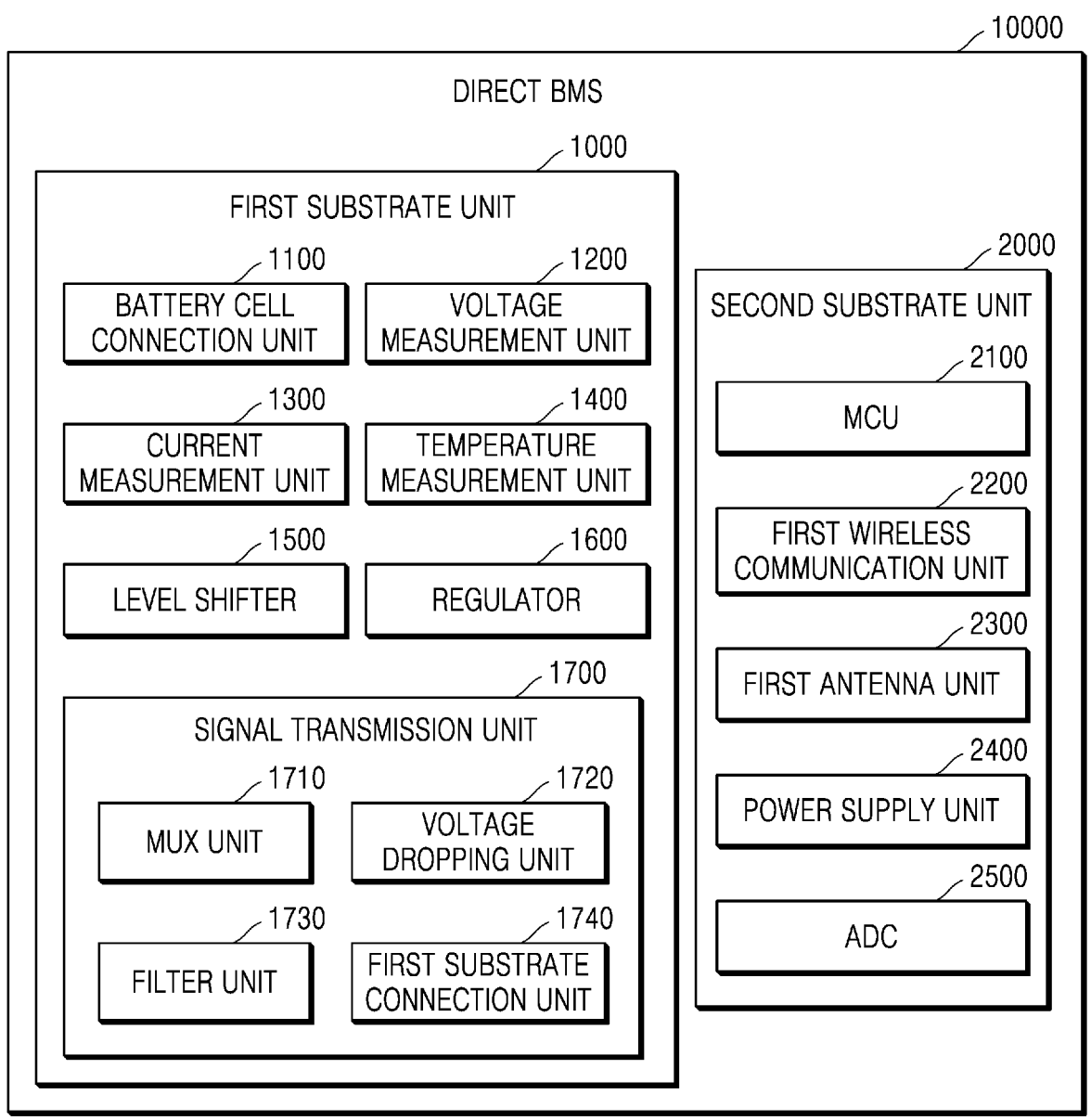
FIGS. 2 and 3 schematically illustrate an internal configuration of a direct BMS according to one embodiment of the present invention.
Figure 3:
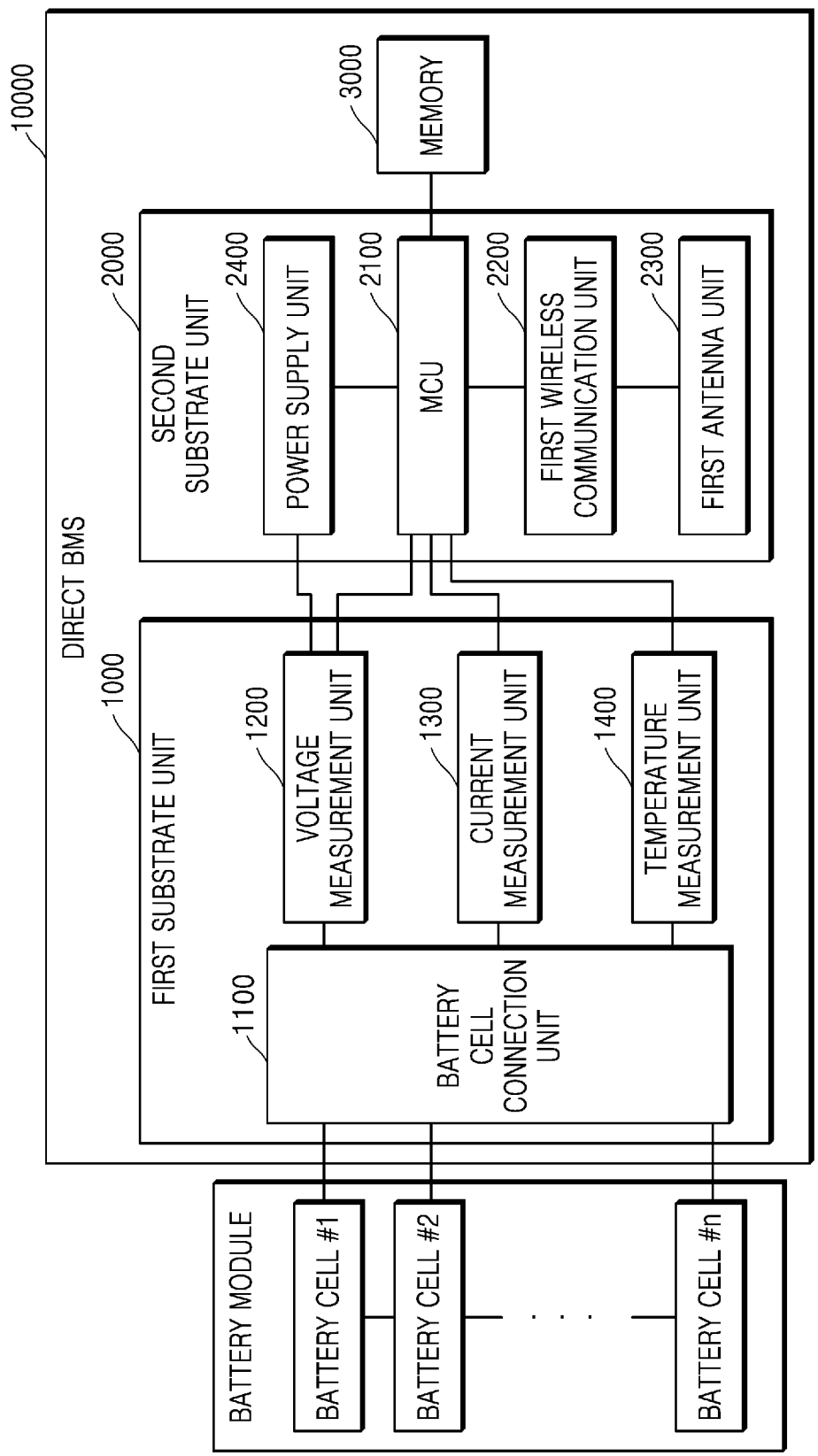

FIGS. 2 and 3 schematically illustrate an internal configuration of the direct BMS according to one embodiment of the present invention.

As illustrated in FIGS. 2 and 3, a system for diagnosing a battery cell located inside a vehicle incudes: a plurality of direct BMSs 10000 located inside the vehicle and electrically connected to a plurality of battery cells included in a battery module; and a master BMS 20000 located inside the vehicle and configured to wirelessly communicate with the direct BMSs 10000, wherein the direct BMS 10000 includes: a first substrate unit 1000; and a second substrate unit 2000, the first substrate unit 1000 includes: a battery cell connection unit 1100 including a plurality of ports that physically and electrically come into direct contact with an exposed electrode of each of the plurality of battery cells; a multiplexer (MUX) unit 1710 configured to receive analog voltage signals of the plurality of ports of the battery cell connection unit 1100 and sequentially output any one of the analog voltage signals; a voltage dropping unit 1720 configured to drop the analog voltage signal output from the MUX unit 1710; a current measurement unit 1300 configured to measure a current for all of the plurality of battery cells to generate an analog current signal; a temperature measurement unit 1400 configured to generate an analog temperature signal; and a first substrate connection unit 1740 configured to receive the analog voltage signal, the analog current signal, and the analog temperature signal to output the analog voltage signal, the analog current signal, and the analog temperature signal to the second substrate unit 2000, and the second substrate unit 2000 converts the received analog voltage signal, analog current signal, and analog temperature signal into digital signals to wirelessly transmit the digital signals to the master BMS 20000.

Schematically, FIG. 2 illustrates an internal configuration of the direct BMS 10000, and FIG. 3 illustrates a connection relationship of some of the configurations illustrated in FIG. 2.

In detail, the direct BMS 10000 mainly includes the first substrate unit 1000 and the second substrate unit 2000 which are implemented by different processes. The first substrate unit 1000 and the second substrate unit 2000, which are implemented by different processes, are configured as one system semiconductor chip by applying a multi chip package (MCP) technology.

In more detail, the first substrate unit 1000 includes a substrate and an element which are manufactured by an LDCMOS process and operable in a first power range of 36 V or less. More preferably, the first power range is 32 V to 36 V.

The conventional battery management system uses a chip, a module, or the like that is implemented by the BCD process. The BCD process refers to a process technology for integrating three processes, including Bipolar, CMOS, and DMOS, into one process. The BCD process has an advantage of withstanding high voltage, and thus has been used in power semiconductors, motor drive ICs, LED driver ICs, and the like. In other words, in the conventional battery management system, a high voltage is required to diagnose the battery, and in order to withstand the high voltage, a chip or a module implemented by the BCD process, which is capable of withstanding the voltage up to several hundreds of volts (V), is used. Meanwhile, it is impossible for the battery management system using the BCD process to sense or diagnose precise information about the battery due to process reasons.

In order to overcome the above-described disadvantages of the BCD process, the inventor of the present invention adds a configuration for dropping the high voltage outputted from the plurality of battery cells to the first substrate unit 1000, thereby lowering the voltage outputted from the plurality of battery cells to the first power range of 32 V to 36 V. That is, by using a chip or a module implemented by the LDCMOS process corresponding to a low-power process instead of the BCD process which makes it difficult to precisely measure the battery due to process characteristics, it is possible to more accurately measure the voltage and the current for a battery module connected to the corresponding direct BMS 10000 compared to the related art. In this case, the RAW voltage signal measured by the voltage measurement unit 1200 corresponds to a signal before passing through the configuration for dropping the voltage described above.

The first substrate unit 1000 having the above-described technical features includes the battery cell connection unit 1100, the voltage measurement unit 1200, the current measurement unit 1300, the temperature measurement unit 1400, a level shifter 1500, a regulator 1600, and a signal transmission unit 1700. That is, since the first substrate unit 1000 is directly connected to the plurality of battery cells, the first substrate unit 1000 is driven in a power range higher than a second power range in which the second substrate unit 2000 is operable, and generates an analog electrical signal by acquiring voltages, currents, and temperatures for the plurality of battery cells. The respective configurations included in the first substrate unit 1000 will be described later in more detail.

Meanwhile, the second substrate unit 2000 includes a configuration to receive the analog electrical signal generated by the first substrate unit 1000 to wirelessly transmit the analog electrical signal to the master BMS 20000. Schematically, an ADC 2500 of the second substrate unit 2000 may receive the analog electrical signal to convert the analog electrical signal into a digital signal, and the converted digital signal may be wirelessly transmitted to the master BMS 20000 via a first wireless communication unit 2200 and a first antenna unit 2300. The respective configurations included in the second substrate unit 2000 will be described later in more detail.

As illustrated in FIG. 3, the battery cell connection unit 1100 included in the first substrate unit 1000 includes a plurality of ports, and electrodes of each of the plurality of battery cells connected to the corresponding direct BMS 10000 physically comes into direct contact with each other without a separate cable. Through the above configuration, it is possible to solve the following problems in the related art.

In the conventional battery management system technology, the plurality of battery cells are grouped, and signal output lines of the grouped battery cells are connected to a single slave BMS. For example, when it is assumed that 25 battery cells are present in one battery module, 5 of the 25 battery cells are grouped into 5 groups, and signals obtained by measuring voltages and currents of all of the 5 battery cells are transmitted to the slave BMS through separate wired communication. In addition, since signals transmitted from each of the 5 signal lines may not be simultaneously transmitted to the slave BMS, a module capable of switching channels between the 5 signal lines and the slave BMS is required.

Therefore, one slave BMS receives information through a total of 5 signal lines for 25 battery cells, and in this process, there is a problem that noise is generated by the switching module. Further, in the battery management system having the above configuration, an isolator for separating a signal component is required to be applied or installed at a plurality of positions in order to prevent electro-magnetic interference from being induced between a plurality of signal lines.

That is, in order to solve problems that may occur due to switching noise or a separating element in the related art, the present invention has a configuration of the battery cell connection unit 1100 in which each of the plurality of ports physically comes into direct contact with the electrodes of each of the plurality of battery cells. The configuration of the battery cell connection unit 1100 will be described later with reference to the description of FIG. 4.

Further, as illustrated in FIG. 3, the first substrate unit 1000 includes a voltage measurement unit 1200, a current measurement unit 1300, and a temperature measurement unit 1400. The voltage measurement unit 1200 is configured in the form of a circuit and measures the voltage of each of the plurality of battery cells included in the battery module connected to the direct BMS 10000 through the battery cell connection unit 1100. More specifically, referring to FIGS.

4 and 5, the battery cell connection unit 1100 includes a plurality of voltage measurement ports, in which the number of voltage measurement ports corresponds to the number of battery cells included in the battery module, and the voltage measurement unit 1200 may measure the voltage of each of the plurality of battery cells of the corresponding battery module through the voltage measurement port.

In this case, the voltage is measured based on a PAW voltage signal for each battery cell, and the PAW voltage signal means an electrical signal which is not interfered or distorted by an external factor. That is, the voltage measurement unit 1200 may derive voltage information precisely and accurately measured for each of the plurality of battery cells based on the PAW voltage signal of each of the plurality of battery cells received through the plurality of voltage measurement ports, and then may transmit the voltage information to the MCU 2100 of the second substrate unit 2000, and the MCU 2100 may transmit the received voltage information to the master BMS 20000 through a wireless communication scheme.

Additionally, the voltage measurement unit 1200 may be connected to a high voltage alarm module (not illustrated) and a low voltage alarm module (not illustrated), and when the voltage of one or more specific battery cells is higher than a predetermined reference, the high voltage alarm module or the low voltage alarm module may immediately generate an alarm message to transmit the alarm message to the master BMS 20000 through the first wireless communication unit 2200. In one embodiment of the present invention, when the high voltage alarm message or the low voltage alarm message is transmitted to the master BMS 20000, the master BMS 20000 may command the corresponding direct BMS 10000 to perform cell balancing so as to adjust the voltage between cells, or may cut off power of the corresponding direct BMS 10000.

Figure 5:
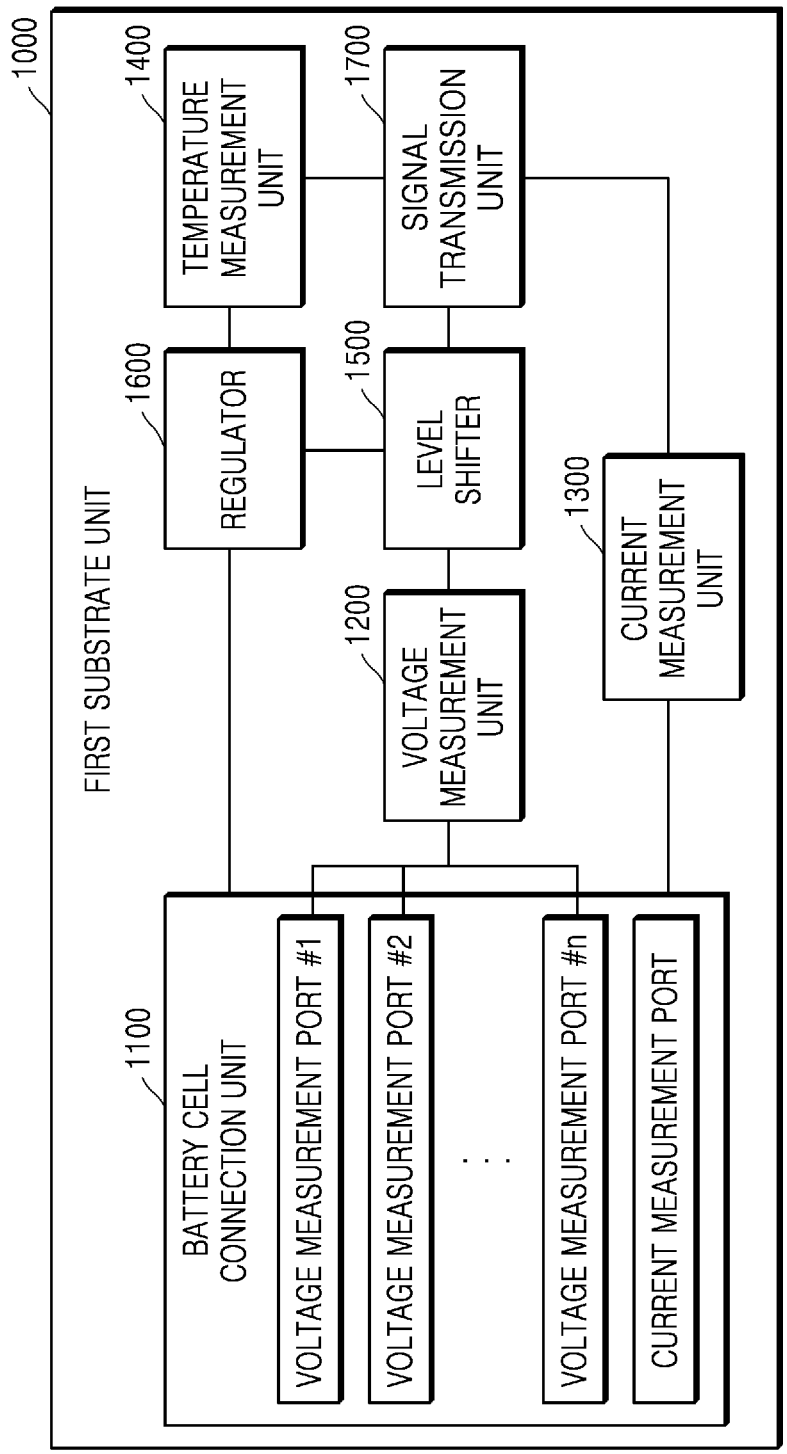
FIG. 5 schematically illustrates an internal configuration of a first substrate unit according to one embodiment of the present invention.

Referring to FIG. 5, the current measurement unit 1300 is configured in the form of a circuit, and measures the current of the battery module connected to the corresponding direct BMS 10000 through the current measurement port. More specifically, the current measurement port may be located at an output terminal of a battery module or a battery cell group connected to the direct BMS 10000, and the current measurement unit 1300 is preferably provided to electrically and physically come into direct contact with the corresponding battery module.

The current measured through the current measurement port is measured based on a PAW current signal for the corresponding battery module, and the RAW current signal means an electrical signal which is not interfered or distorted by an external factor like the RAW voltage signal described above. That is, the current measurement unit 1300 measures accurate current information about the corresponding battery module based on the RAW current signal for the battery module received through the current measurement port, and then transmits the measured accurate current information to the MCU 2100, and the MCU 2100 transmits the received current information to the master BMS 20000 in a wireless communication manner.

Additionally, the current measurement unit 1300 may be connected to an overcurrent alarm module (not illustrated), and when the current of the corresponding battery module is higher than a predetermined reference, the overcurrent alarm module may immediately generate an alarm message to transmit the alarm message to the master BMS 20000 through the first wireless communication unit 2200.

Figure 4:
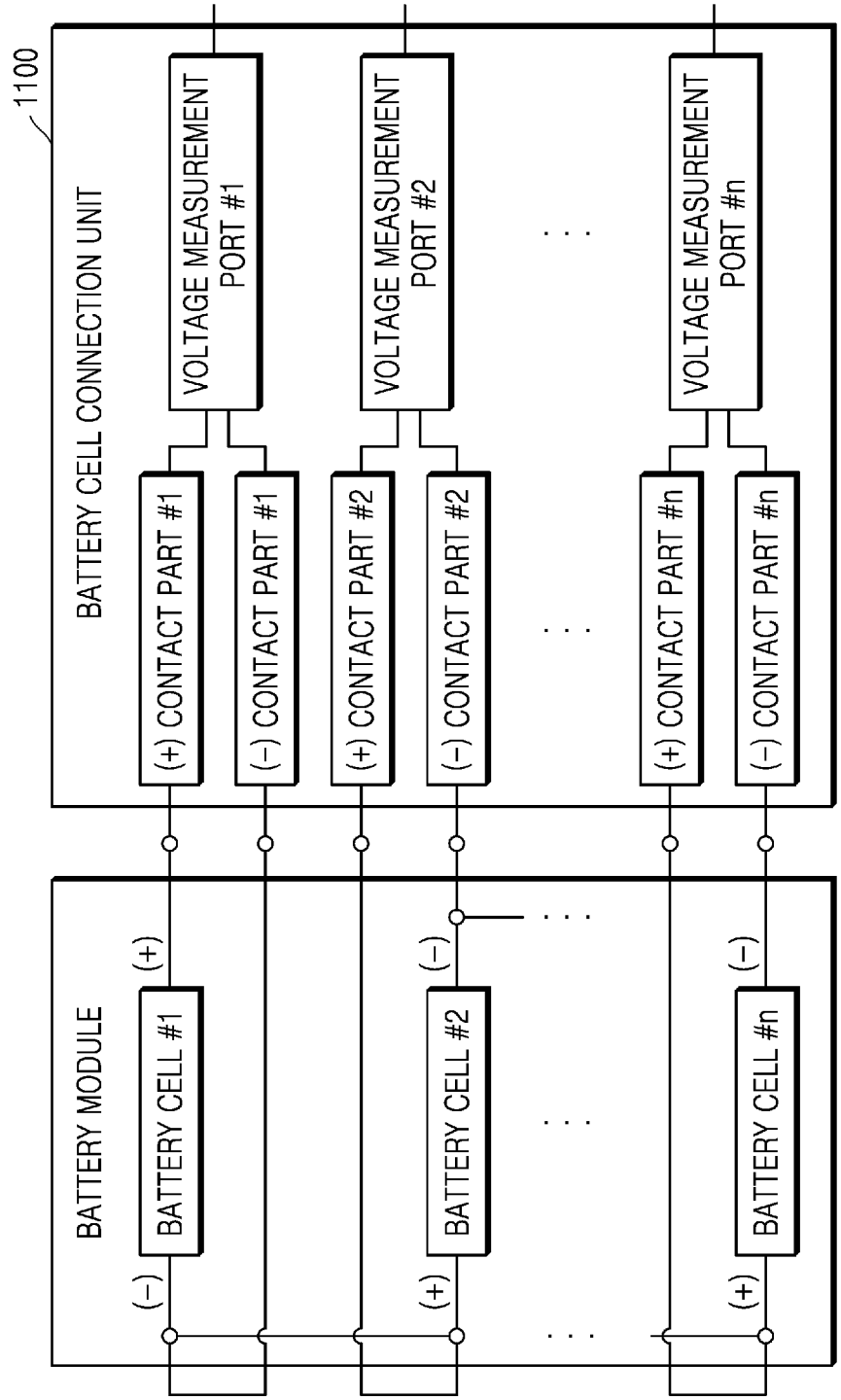
FIG. 4 schematically illustrates configurations of a battery module and a battery cell connection unit according to one embodiment of the present invention.

Meanwhile, according to another embodiment of the present invention, the battery cell connection unit 1100 includes a plurality of current measurement ports, and the plurality of current measurement ports are connected to each of the battery cells to measure the current of each of the plurality of battery cells like the voltage measurement port illustrated in FIG. 4. However, in the present specification, a description will be made based on one embodiment in which the current measurement port is provided at the output terminal of the battery module or the last of the plurality of battery cells to measure the current of the battery module or all of the plurality of battery cells. The current measurement 1300 will be described later with reference to the description of FIG. 9.

The temperature measurement unit 1400 is provided on the first substrate unit 1000 together with the voltage measurement unit 1200 and the current measurement unit 1300, and includes a temperature sensor. The temperature measurement unit 1400 may measure a temperature of the first substrate unit 1000 through the temperature sensor. According to one embodiment of the present invention, the temperature measurement unit 1400 may be connected to an external temperature sensor, and the external temperature sensor may measure a temperature of the battery module connected to the direct BMS 10000 and transmit a measurement result to the temperature measurement unit 1400.

The temperature measurement unit 1400 transmits the temperature result measured for the corresponding battery module to the MCU 2100, and the MCU 2100 transmits the corresponding result to the master BMS 20000 through the first wireless communication unit 2200. The temperature measurement unit 1400 is connected to an overheating alarm module (not illustrated), and when the temperature measured by the temperature measurement unit 1400 is higher than a predetermined reference, the overheating alarm module may immediately generate an alarm message to transmit the alarm message to the master BMS 20000 through the first wireless communication unit 2200. In addition, the temperature measurement unit 1400 may be connected to the voltage measurement unit 1200 to use some of the power introduced into the voltage measurement unit 1200.

As described above, the first substrate unit 1000 includes a configuration to sense information about the battery module connected to the corresponding direct BMS 10000. Meanwhile, as illustrated in FIG. 2, the first substrate unit 1000 may be designed based on individual cells, it is possible to achieve low-power operation compared to the related art in which voltages of all of the plurality of battery cells are measured.

In addition, as illustrated in FIG. 2, the first substrate unit 1000 includes a configuration to lower the voltage or transmit power or information like the level shifter 1500, the regulator 1600, and the signal transmission unit 1700, in addition to a configuration to generate information about the above-described battery cell. A more detailed description of the corresponding configuration will be described later.

Meanwhile, as illustrated in FIGS. 2 and 3, the second substrate unit 2000 includes a configuration to receive information sensed by the first substrate unit 1000 to transmit the information to the master BMS 20000. More specifically, the MCU 2100 of the second substrate unit 2000 may receive the results measured by the voltage measurement unit 1200, the current measurement unit 1300, and the temperature measurement unit 1400, perform data processing, and then transmit the results to the first wireless communication unit 2200. In addition, the MCU 2100 of the second substrate unit 2000 controls each of the detailed configurations of the direct BMS 10000 including the voltage measurement unit 1200, the current measurement unit 1300, and the temperature measurement unit 1400.

The first wireless communication unit 2200 is connected to the MCU 2100 to wirelessly communicate with the master BMS 20000. As illustrated in FIG. 5, the first wireless communication unit 2200 includes a modem unit and a transceiver unit 2220, and performs steps of: modulating binarized data, which is received from the MCU 2100, into a phase shift modulation signal (PSMS) and modulating the phase shift modulation signal into a differential phase shift modulation signal (DPSMS) to transmit the PSMS and DPSMS to the outside, in order to transmit the data received from the MCU 2100 to the master BMS 20000; and demodulating the differential phase shift modulation signal (DPSMS), which is received from the first antenna unit 2300, into a phase shift modulation signal (PSMS) and demodulating the decoded phase shift modulation signal (PSMS) into binarized data to transmit the binarized data to the MCU 2100, in order to receive the data from the master BMS 20000.

Figure 8:
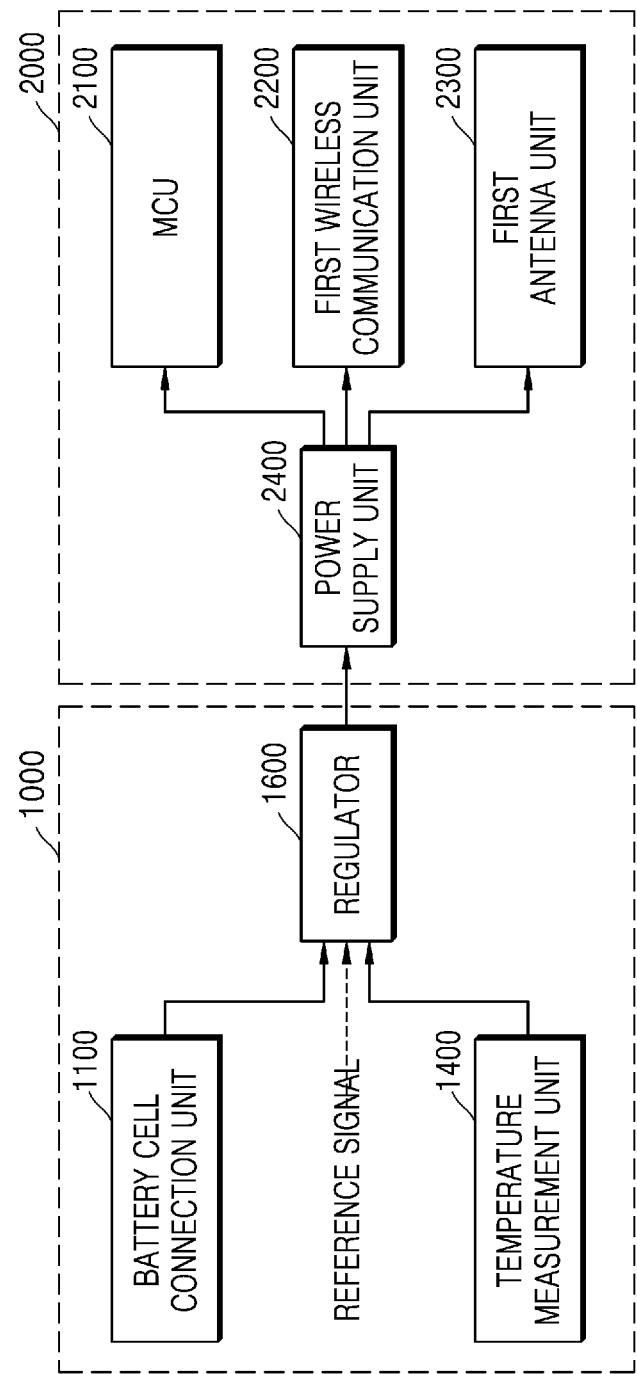
FIG. 8 schematically illustrates a process of transmitting driving power of the direct BMS according to one embodiment of the present invention.

The first antenna unit 2300 connected to the first wireless communication unit 2200 is configured in the form of a circuit. The first antenna unit 2300 receives a signal modulated by the first wireless communication unit 2200 to broadcast the signal to the outside, or receives the signal broadcasted by the master BMS 20000 to transmit the signal to the first wireless communication unit 2200. Referring to FIG. 8, the signal broadcasted by the first antenna unit 2300 may be received by the second antenna unit 23000 of the master BMS 20000. In a preferred embodiment, an antenna included in the first antenna unit 2300 may transmit and receive radio waves in a 900 MHz band.

Meanwhile, as illustrated in FIG. 2, the first substrate unit 1000 and the second substrate unit 2000 are illustrated as being physically provided at different positions, but in the direct BMS 10000 of the present invention, an MCP process may be applied so that the first substrate unit 1000 and the second substrate unit 2000 may be provided on the same semiconductor chip as described above. For example, the direct BMS 10000 may be implemented in such a manner that the second substrate unit 2000 is stacked on the first substrate unit 1000 or the first substrate unit 1000 is stacked on the second substrate unit 2000.

The MCP process is a process technology in which two or more semiconductor chips are stacked to form one package, and the present invention uses the MCP process to implement a more miniaturized direct BMS 10000 and to reduce manufacturing costs. Additionally, according to one embodiment of the present invention, a flash memory 3000 illustrated in FIG. 2 may also be implemented by being stacked on the same semiconductor chip as the first substrate unit 1000 and the second substrate unit 2000.

FIG. 4 schematically illustrates a configuration of the battery module and the battery cell connection unit 1100 according to one embodiment of the present invention.

As illustrated in FIG. 4, the positive electrode terminal and the negative electrode terminal of each of the plurality of battery cells comes into direct contact with ports provided in the battery cell connection unit 1100, and the voltage measurement unit 1200 is connected to each of the ports to measure a voltage of each of the battery cells.

Specifically, as described above, the voltage measurement unit 1200 of the direct BMS 10000 may receive a RAW voltage signal for each of the plurality of battery cells, which is included in the battery module connected to the direct BMS 10000, through the plurality of voltage measurement ports included in the battery cell connection unit 1100 to measure the accurate voltage of each battery cell.

More specifically, the plurality of battery cells in the battery module are connected in series, and in a preferred embodiment, the plurality of battery cells in the battery module may be disposed such that a (+) electrode and a (−) electrode intersect each other. The exposed (+) electrode and the exposed (−) electrode of each of the battery cells physically and electrically come into direct contact with a (+) contact portion and a (−) contact portion of the battery cell connection unit 1100, respectively. That is, the (+) electrode of the battery cell corresponds to a configuration that is directly connected to the (+) contact portion located inside the battery cell connection unit 1100, and the (−) electrode of the battery cell corresponds to a configuration that is directly connected to the (−) contact portion located inside the battery cell connection unit 1100.

In addition, referring to FIG. 4, each of the plurality of voltage measurement ports connected to the voltage measurement unit 1200 physically and electrically comes into direct contact with one (+) contact portion and one (−) contact portion at the same time. Through the above configuration, each of the plurality of voltage measurement ports may receive a PAW voltage signal for each of the battery cells, and the voltage measurement unit 1200 may accurately measure a voltage for the corresponding battery cell based on the received PAW voltage signal.

That is, unlike the conventional battery management system technology, the configuration for measuring the voltage in the present invention does not cause interference or loss in the process in which data or a signal, starting from the battery cell, is transmitted to the direct BMS 10000, and thus the PAW voltage signal may be directly transmitted to the direct BMS 10000, and the voltage measurement unit 1200 in the direct BMS 10000 may measure the accurate voltage based on the transmitted PAW voltage signal. Therefore, the above-described configuration may exclude an electro-magnetic interference isolator included in the conventional battery management system.

Meanwhile, as illustrated in FIG. 5, the current measurement port of the battery cell connection unit 1100 also physically and electrically comes into direct contact with the battery module, so that the PAW current signal may be directly transmitted to the direct BMS 10000, and the current measurement unit 1300 in the direct BMS 10000 may accurately and precisely measure the current flowing in the battery module based on the PAW current signal.

In addition, in one embodiment of the present invention, the voltage measurement unit 1200 and the current measurement unit 1300 may measure the voltage and the current of the battery cell over time, and may transmit waveforms of the output voltage and waveforms of the output current of the corresponding battery cell over time to the MCU 2100.

Additionally, individual impedance of each of the plurality of battery cells may be derived through the configuration of the direct BMS 10000 that is directly connected to the battery module, and the individual impedance of each of the plurality of battery cells is derived so that abnormal battery cells in the battery module may be individually detected. For example, it is possible to prevent problems such as fire, which may be caused due to non-balance of voltages between the plurality of battery cells, in an early stages, and this corresponds to an improved configuration and effect compared to the related art in which the average or total voltage in the battery module is measured.

FIG. 5 schematically illustrates an internal configuration of the first substrate unit 1000 according to one embodiment of the present invention.

In detail, as described above, the voltage measurement unit 1200 measures a voltage of each of the plurality of battery cells through a plurality of voltage measurement ports. Meanwhile, since the signal measured by the voltage measurement unit 1200 is a RAW voltage signal, the voltage is in a high state, and thus the configuration to lower the voltage is required to transmit the voltage signal to the second substrate unit implemented by the low voltage process.

As illustrated in FIG. 5, the RAW voltage signal, passing through the voltage measurement unit 1200, is transmitted to the level shifter 1500. The level shifter 1500 receives power of all of the plurality of battery cells to transmit the power to the regulator 1600 and the signal transmission unit 1700 by lowering a voltage level of the corresponding voltage signal to a predetermined level or less. The regulator 1600 transmits the power received from the level shifter 1500 to a power supply unit 2400 of the second substrate unit 2000 by lowering the voltage to a voltage level corresponding to the second power range of 5 V or less. Referring to FIG. 2, the power transmitted to the power supply unit 2400 is used as driving power of the MCU 2100, the first wireless communication unit 2200, and the first antenna unit 2300 of the second substrate unit 2000. In addition, the power output from the level shifter 1500 or the regulator 1600 may be used as driving power of a configuration included in the first substrate unit 1000 or a signal required to operate a specific configuration.

The signal transmission unit 1700 transmits the measurement information generated by the first substrate unit 1000 to the second substrate unit 2000. More specifically, as described above, the analog voltage signal, which is generated by the voltage measurement unit 1200, reaches the signal transmission unit 1700 after adjusting the voltage level via the level shifter 1500, and the signal transmission unit 1700 transmits the analog voltage signal, the voltage level of which has been adjusted, to the MCU 2100 of the second substrate unit 2000.

Meanwhile, as illustrated in FIG. 5, the signal transmission unit 1700 receives not only the voltage signal, but also the analog current signal generated by the current measurement unit 1300 and temperature information generated by the temperature measurement unit 1400 to transmit the voltage signal, the analog current signal, and the temperature information to the second substrate unit 2000.

As described above, the direct BMS 10000 of the present invention separately includes a configuration for transmitting the power and a configuration for transmitting the information between the first substrate unit 1000 and the second substrate unit 2000, so that it is possible to achieve low-power operation and more accurately diagnose a state of the battery.

Figure 6:
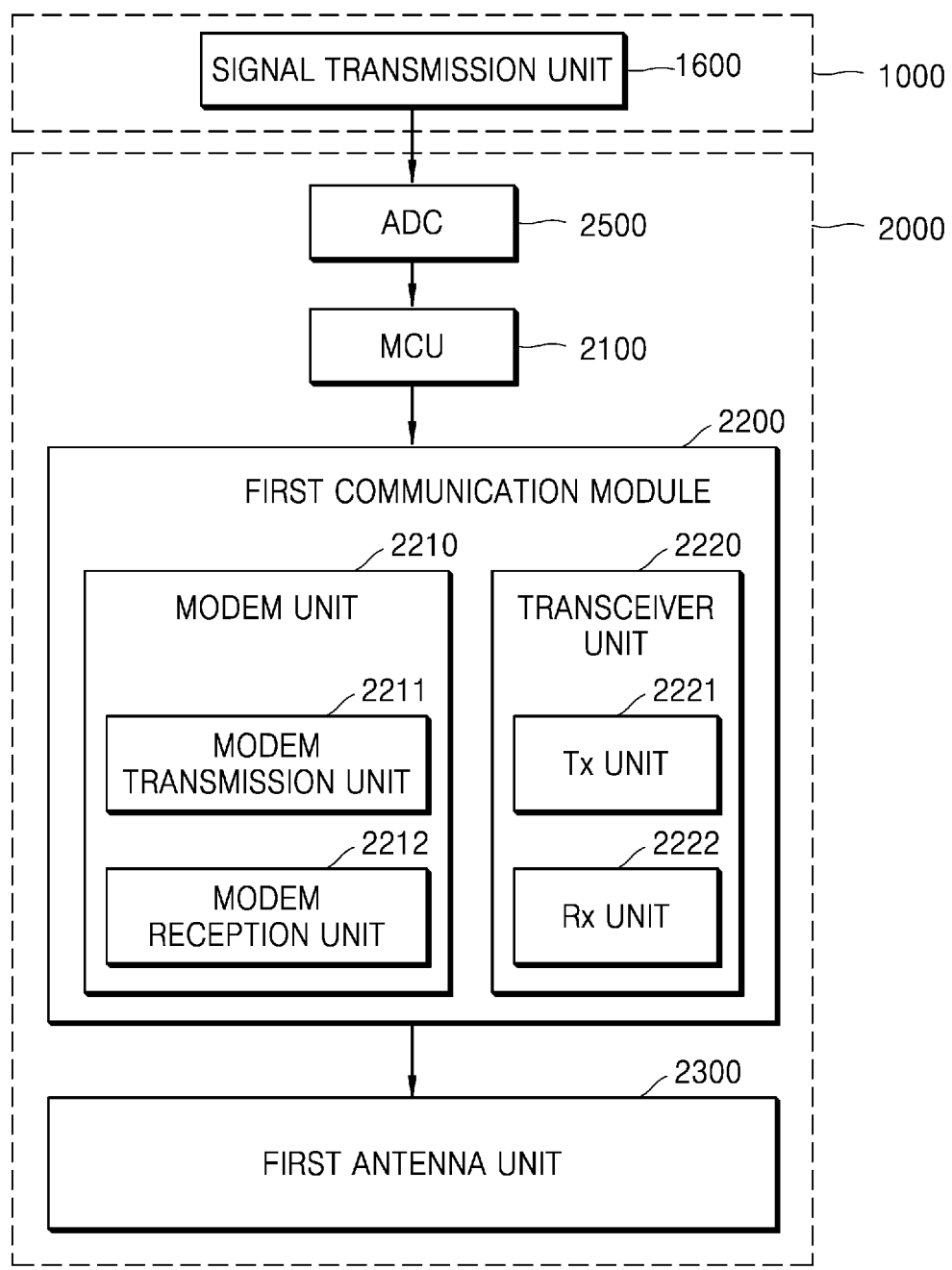
FIG. 6 schematically illustrates an internal configuration of a second substrate unit according to one embodiment of the present invention.

FIG. 6 schematically illustrates an internal configuration of the second substrate unit 2000 according to one embodiment of the present invention.

As illustrated in FIG. 6, the second substrate unit 2000 operates in the second power range of 5 V or less and includes an ADC 2500, in which the ADC 2500 converts the analog electrical signal received from the signal transmission unit 1700 into a digital electrical signal to transmit the digital electrical signal to the MCU 2100.

In addition, the second substrate unit 2000 further includes: a modem unit including a modem transmission unit 2211 configured to perform modulation for transmitting the information received from the MCU 2100 to the master BMS 20000, and a modem reception unit 2212 configured to perform demodulation for transmitting the signal received from the master BMS 20000 to the MCU 2100; and a first wireless communication unit 2200 including a transceiver unit 2220 that includes: a Tx unit 2221 configured to broadcast the signal modulated by the modem transmission unit 2211 through the first antenna unit 2300; and an Rx unit 2222 configured to process the signal received through the first antenna unit 2300.

Specifically, referring to the description of FIG. 4, the signal transmission unit 1700 transmits measurement information including the analog voltage signal and the analog current signal to the second substrate unit 2000, and the analog to digital converter (ADC) 2500 of the second substrate unit 2000 receives the measurement information to convert the measurement information into a digital signal. Meanwhile, the second substrate unit 2000 operates in a second power range (5 V or less) less than the first power range (32 V to 36 V) in which the first substrate unit 1000 implemented by the LDCMOS process operates.

That is, the second substrate unit 2000 and the first substrate unit 1000 are implemented by different processes, and the ADC 2500 is included in the second substrate unit 2000 driven with less power as described above.

More specifically, the ADC 2500 for converting an analog signal into a digital signal has characteristics in that a size thereof is increased in a process for a high voltage due to process characteristics, and a processing speed thereof is decreased so that performance thereof is deteriorated. That is, when the ADC 2500 is provided on a chip designed for a process for a low voltage, high performance may be exhibited through the ADC 2500 having a smaller size. However, as described above, in the conventional battery management system technology, a chip or a module implemented by the BCD process, which is a process for high voltage, has been used for durability, and accordingly, the ADC 2500 having a large size and slightly poor performance has to be used.

However, in the present invention, in order to solve the problem, a configuration (the level shifter 1500, the regulator 1600, the signal transmission unit 1700, etc.) for dropping a voltage is added to the first substrate unit 1000, and the ADC 2500 is provided on the second substrate unit 2000 implemented by a process for a low voltage of 5 V or less, thereby reducing the size of the ADC 2500 and improving performance.

The ADC 2500 of the present invention, which has the above-described technical features, converts the analog electrical signal received from the signal transmission unit 1700 into a digital electrical signal to transmit the electrical signal to the MCU 2100. Thereafter, the MCU 2100 performs signal processing to wirelessly transmit data based on the information, which is received from the ADC 2500, to the master BMS 20000 through the first wireless communication unit 2200 and the first antenna unit 2300.

As illustrated in FIG. 6, the first wireless communication unit 2200 includes the modem unit and the transceiver unit 2220, in which the modem unit includes the modem transmission unit 2211 configured to perform modulation for transmitting the information received from the MCU 2100 to the master BMS 20000, and the modem reception unit 2212 configured to perform demodulation for transmitting the signal received from the master BMS 20000 to the MCU 2100.

In addition, the transceiver unit 2220 includes the Tx unit 2221 including a configuration to broadcast the signal modulated by the modem transmission unit 2211 through the first antenna unit 2300, and the Rx unit 2222 including a configuration to process the signal received through the first antenna unit 2300.

More specifically, the modem transmission unit 2211 includes a hardware and/or software configuration to modulate digital data received from the MCU 2100 into a phase shift modulation signal (PSMS) and modulate the phase shift modulation signal into a differential phase shift modulation signal (DPSMS), and the modem reception unit 2212 includes a hardware and/or software configuration to demodulate the received differential phase shift modulation signal (DPSMS) into a phase shift modulation signal (PSMS) and demodulate the demodulated phase shift modulation signal (PSMS) into a digital signal.

Meanwhile, the Tx unit 2221 includes a hardware and/or software filter for processing the signal modulated by the modem transmission unit 2211, a digital to analog converter (DAC), and the like, and the Rx unit 2222 includes a hardware and/or software filter for processing the signal received by the first antenna unit 2300, the ADC 2500, and the like.

That is, the information received from the MCU 2100 of the direct BMS 10000 may be transmitted to the first antenna unit 2300 via the modem transmission unit 2211 and the Tx unit 2221 and transmitted to the master BMS 20000, and the information transmitted from a control unit 21000 of the master BMS 20000 is received through the first antenna unit 2300 and transmitted to the MCU 2100 via the Rx unit 2222 and the modem reception unit 2212.

As described above, through the wireless communication scheme using the differential phase shift modulation signal (DPSMS) and the phase shift modulation signal (PSMS), it is possible to achieve more stable wireless communication in an environment in which line of sight (LOS) is not secured inside the battery pack of the vehicle due to aluminum shielding or the like.

In addition, the wireless communication scheme of the present invention does not include a configuration related to a communication station that relays the communication, which is adopted in a conventional battery management system including a slave BMS or a module BMS, thereby achieving a more simplified configuration of a wireless communication system.

In addition, the wireless communication scheme of the present invention performs asynchronous wireless communication, thereby not requiring a separate configuration for synchronization during wireless communication, and it is possible to solve problems such as deterioration of space efficiency, increase in weight, increase in cost, and the like, which occur when an isolator for preventing electromagnetic interference from being induced in a conventional wired BMS-related technology is applied or installed at a plurality of locations.

Figure 7:
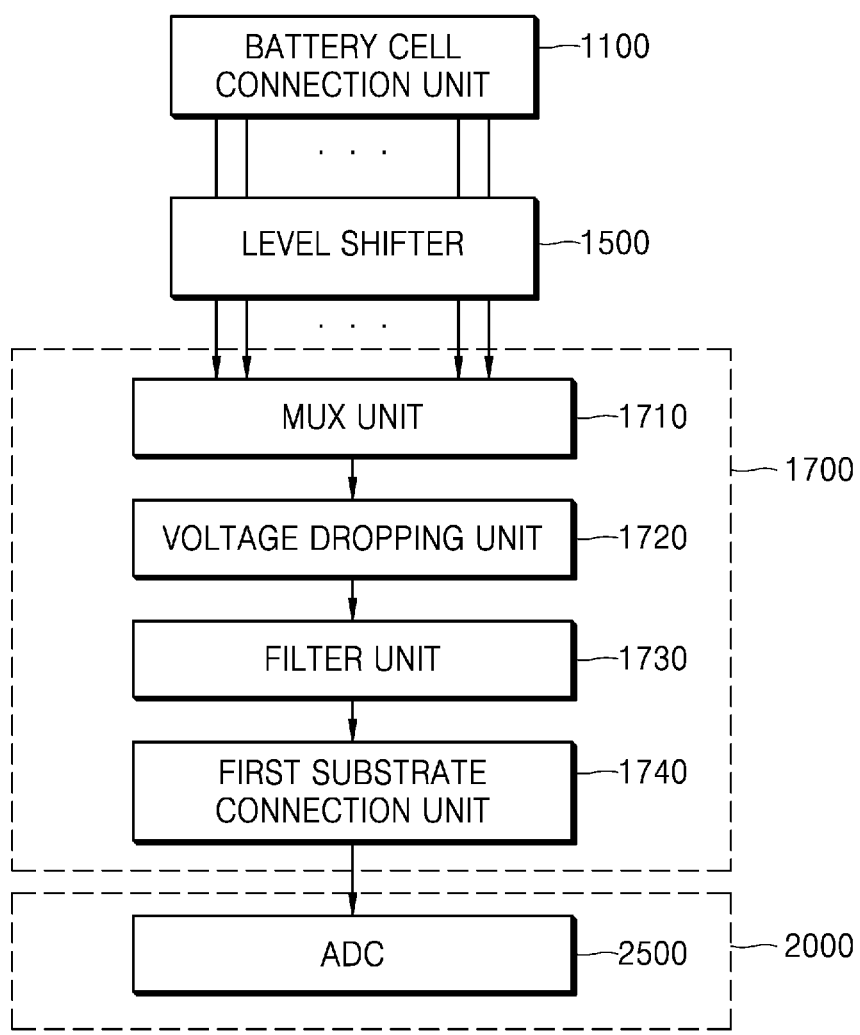
FIG. 7 schematically illustrates an internal configuration of a signal transmission unit according to one embodiment of the present invention.

FIG. 7 schematically illustrates an internal configuration of the signal transmission unit 1700 according to one embodiment of the present invention.

As illustrated in FIG. 7, the signal transmission unit 1700 includes: a multiplexer (MUX) unit 1710 including a circuit configured to output one of electrical signals for each of the plurality of battery cells under a control of the MCU 2100; a voltage dropping unit 1720 including a circuit configured to drop a voltage signal received from the voltage measurement unit 1200 under the control of the MCU 2100; and a filter unit 1730 including a circuit configured to reduce noise of the electrical signal received from the voltage measurement unit 1200, and the signal transmission unit 1700 transmits an analog voltage signal to the ADC 2500 after reducing a magnitude of the voltage signal, which is transmitted through the battery cell connection unit, to a predetermined reference or less.

FIG. 7 schematically illustrates a configuration in which the analog voltage signal of each of the plurality of battery cells is generated by the first substrate unit 1000, and then transmitted to the second substrate unit 2000.

In detail, referring to FIGS. 4 and 5, the voltage of each of the plurality of battery cells is measured by the voltage measurement unit 1200 through the plurality of voltage measurement ports included in the battery cell connection unit 1100. In this case, the analog voltage signal generated by the voltage measurement unit 1200 is transmitted to the level shifter 1500 and converted into an analog signal having a voltage level of a predetermined level or less. Thereafter, the voltage signal, of which the voltage level has been converted by the level shifter 1500, is transmitted to the MUX unit as illustrated in FIG. 7.

The MUX unit 1710 includes a circuit for outputting one of the electrical signals for each of the plurality of battery cells. For example, in a case of the direct BMS 10000 to which the battery module including battery cells #1 to #8 is connected, the RAW voltage signal of each of battery cells #1 to #8 is transmitted to the voltage measurement unit 1200 through the battery cell connection unit 1100, and the analog voltage signals (for example, voltage signals #1 to #8) for battery cells #1 to #8 generated by the voltage measurement unit 1200 are transmitted to the MUX unit 1710, respectively. Thereafter, the MUX unit 1710 transmits one of voltage signals #1 to #8 to the voltage dropping unit 1720 according to a predetermined rule.

According to one embodiment of the present invention, the MUX unit 1710 may output one of the plurality of electrical signals to the voltage dropping unit 1720 under the control of the MCU 2100 of the second substrate unit 2000, according to another embodiment of the present invention, a configuration may be added between the battery cell connection unit 1100 and the MUX unit 1710 to amplify the voltage signal or the current signal transmitted from the plurality of battery cells, to convert impedance so as to be suitable for connection with a circuit at a rear end, or to protect the circuit itself from an external noise/static electricity, and according to still another embodiment of the present invention, a configuration including a circuit that is adjusted to be suitable for connection with the circuit at the rear end by lowering or raising a level of the voltage signal received from the plurality of battery cells may be further added.

The voltage drop unit 1720 includes a circuit for dropping the voltage signal received from the MUX unit 1710 under the control of the MCU 2100. In a preferred embodiment, the voltage level of the voltage signal received from the MUX unit 1710 may be lowered to ½ or ¼, and the second substrate unit 2000 may be driven in a power range that is smaller than that of the first substrate unit 1000 through the configuration for adjusting the level of the voltage signal described above or the configuration of the voltage dropping unit 1720.

The analog voltage signal passing through the voltage dropping unit 1720 is transmitted to a first substrate connection unit 1740 via the filter unit 1730. The filter unit 1730 includes a circuit for reducing unnecessary high frequency noise included in the electrical signal received from the voltage measurement unit 1200, and may include a low pass filter (LPF) in a preferred embodiment.

The analog voltage signal passing through the filter unit 1730 may be transmitted to the second substrate unit 2000 through the first substrate connection unit 1740, and more specifically, may be transferred to the ADC 2500 of the second substrate unit 2000, converted into a digital signal, and then transferred to the MCU 2100. Although FIG. 7 illustrates only a configuration in which the first substrate connection unit 1740 receives only the analog voltage signal, referring to FIG. 5, the first substrate connection unit 1740 may receive a current signal and temperature information from the current measurement unit 1300 and the temperature measurement unit 1400 to transmit the received current signal and temperature information to the ADC 2500.

FIG. 8 schematically illustrates a process of transmitting driving power of the direct BMS 10000 according to one embodiment of the present invention.

As illustrated in FIG. 8, the regulator 1600 supplies the power to the power supply unit 2400 by lowering the magnitude of the voltage signal of all of the plurality of battery cells to a predetermined reference or less when a reference temperature is received and the temperature information received from the temperature measurement unit 1400 is less than a predetermined reference, and stops power supply to the power supply unit 2400 when the reference signal is not received or the temperature information received from the temperature measurement unit 1400 is equal to or greater than the predetermined reference.

In detail, the regulator 1600 receives the power of all of the plurality of battery cells through the battery cell connection unit 1100, lowers the received power, and then transmits the lowered power to the power supply unit 2400 of the second substrate unit 2000. As illustrated in FIG. 8, the regulator 1600 receives the entire power from the battery cell connection unit 1100, and according to one embodiment of the present invention, the regulator 1600 may receive the power with a lowered voltage of a predetermined reference or less through a configuration including a circuit for appropriately adjusting the level of the voltage signals received from the plurality of battery cells to be suitable for connection with the circuit of the rear end by appropriately lowering or raising the level of the voltage signals. The reference signal is a signal including a high signal and a low signal, the regulator 1600 is turned on when the reference signal is input to the regulator 1600 as the high signal, and the regulator 1600 is turned off when the reference signal is input to the regulator 1600 as the low signal.

Meanwhile, the regulator 1600 may be turned on/off according to the temperature information received from the temperature measurement unit 1400 as well as the reference signal. More specifically, when the temperature information transmitted from the temperature measurement unit 1400 is equal to or higher than a preset temperature, the regulator 1600 is turned off even if the high signal is input as the reference signal. In other words, the regulator 1600 operates even when the high reference signal is input to the regulator 1600 and the temperature information of equal to or lower than a predetermined temperature is received from the temperature measurement unit 1400, and accordingly, the driving power is cut off at a specific temperature or higher, thereby protecting the BMS, the battery, and an electric vehicle equipped with the battery.

In addition, in one embodiment of the present invention, the regulator 1600 may determine whether or not the temperature information transmitted from the temperature measurement unit 1400 is equal to or higher than a predetermined reference temperature, but in another embodiment of the present invention, the overheating alarm module connected to the temperature measurement unit 1400 may determine whether or not a temperature of a substrate is equal to or higher than a predetermined reference and may transmit determination information to the regulator 1600.

As described above, when the reference temperature is equal to or lower than the predetermined reference temperature and the high reference signal is input to the regulator 1600, the regulator 1600 transmits the power to the power supply unit 2400 of the second substrate unit 2000 by lowering the power received through the battery cell connection unit 1100 to a predetermined level. The power supply unit 2400 distributes the power to each of the detailed configurations included in the second substrate unit 2000, and in this case, it is preferable that the distributed power corresponds to the second power range (5 V or less) described above.

Although FIG. 8 illustrates a configuration in which the power supply unit 2400 is connected to only the MCU 2100, the first wireless communication unit 2200, and the first antenna unit 2300, the power supply unit 2400 may be connected to the respective configurations (not illustrated in FIG. 2) to supply the power to the corresponding configurations.

Figure 9:
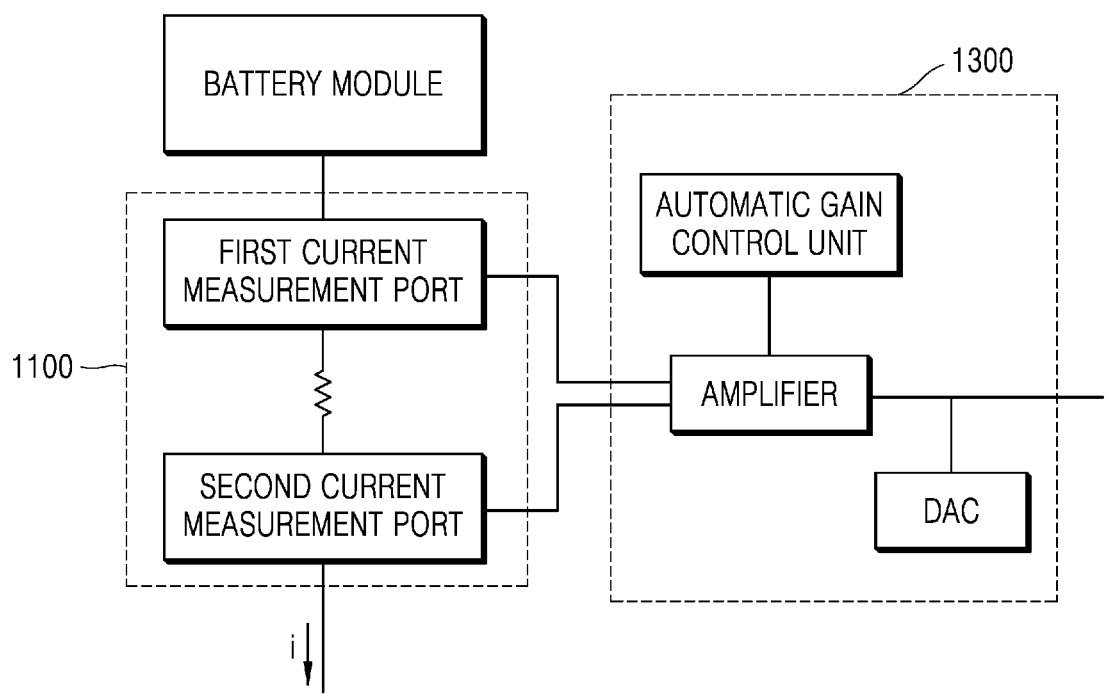
FIG. 9 schematically illustrates a configuration of a current measurement unit according to one embodiment of the present invention.

FIG. 9 schematically illustrates a configuration of the current measurement unit 1300 according to one embodiment of the present invention.

As illustrated in FIG. 9, the battery cell connection unit 1100 includes a current measurement port including a resistor, and the current measurement unit 1300 measures a current of the battery module based on a result of amplifying a voltage difference between both ends of the resistor, and an amplifier for amplifying the voltage difference adjusts an amplification rate by an automatic gain control unit.

Specifically, referring to FIG. 5, the current measurement port included in the battery cell connection unit 1100 includes a first current measurement port and a second current measurement port, and the resistor is provided between the first current measurement port and the second current measurement port. Preferably, the current measurement unit 1300 may derive a voltage difference from each of the first current measurement port and the second current measurement port, increase the voltage difference with an amplification rate, which is determined by the automatic gain control unit, through the amplifier, and then measure a current of the corresponding battery module by using a resistance value of the resistor and the amplified voltage difference.

As described above, the current measurement port is preferably provided on an output terminal of the battery module or the last battery cell of the plurality of battery cells to measure a current of the battery module or currents of all of the plurality of battery cells.

Meanwhile, as in the description of FIG. 3, the current measurement unit 1300 is connected to an overcurrent alarm module. In this case, when an output voltage of the amplifier is too high compared with a specific voltage set by the DAC illustrated in FIG. 9, the overcurrent alarm module may generate an overcurrent alarm message.

Figure 10:
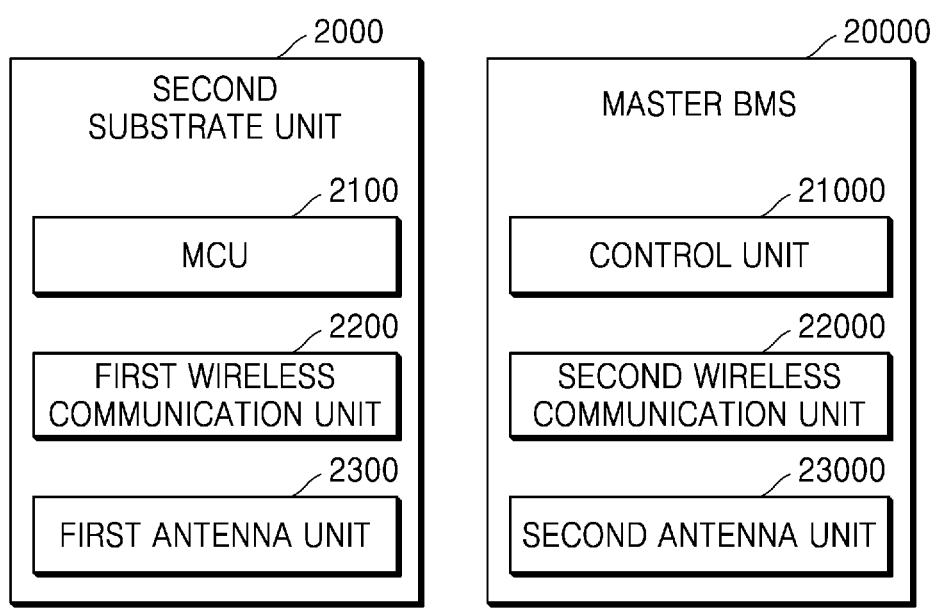
FIG. 10 schematically illustrates an internal configuration for performing asynchronous wireless communication in each of the direct BMS and a master BMS according to one embodiment of the present invention.

FIG. 10 schematically illustrates an internal configuration for performing asynchronous wireless communication in each of the direct BMS 10000 and the master BMS 20000 according to one embodiment of the present invention.

As illustrated in FIG. 10, each of the plurality of direct BMSs 10000 includes the first wireless communication unit 2200 and the first antenna unit 2300 configured to wirelessly communicate with the master BMS 20000, and the master BMS 20000 includes the second wireless communication unit 22000 and the second antenna unit 23000 configured to wirelessly communicate with each of the plurality of direct BMSs 10000. The first wireless communication unit 2200 is connected to the MCU 2100 to receive the information generated by the first substrate unit 1000, and the second wireless communication unit 22000 is connected to the control unit 21000 to transmit the data received from the plurality of direct BMSs 10000 to the control unit 21000.

The control unit 21000 may include one or more memories and one or more processes, and may diagnose a state of each of the battery cells or a state of all of the battery modules connected to the plurality of direct BMSs 10000 based on the data received through the second wireless communication unit 22000. In one embodiment of the present invention, the control unit 21000 may determine the state of the entire battery provided in the corresponding vehicle based on a diagnosis result for the state of the battery module or the battery cell. For example, the control unit 21000 may derive the possibility of fire that may occur during charging, or may derive the remaining traveling distance in real time in consideration of the current traveling state and the battery state during traveling.

Additionally, the control unit 21000 may broadcast control information about each of the plurality of direct BMSs 10000 through the second wireless communication unit 22000 and the second antenna unit 23000. The wireless communication between the master BMS 20000 and the plurality of direct BMSs 10000 will be described later with reference to the description of FIG. 11.

Figure 11:
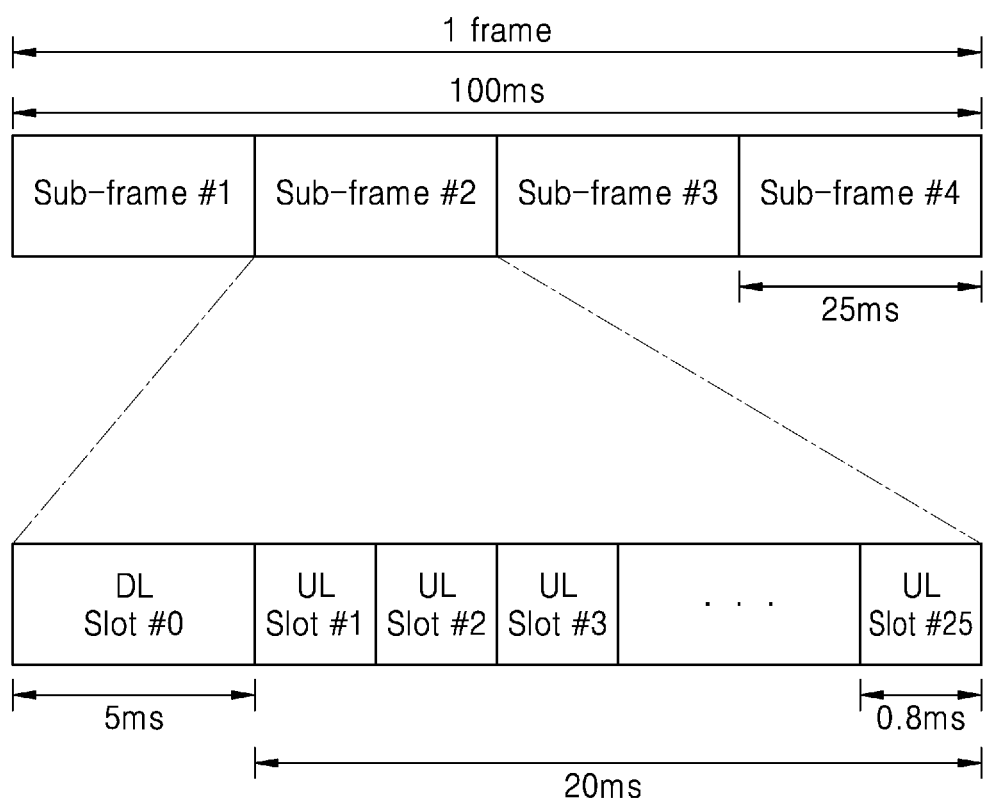
FIG. 11 schematically illustrates a structure of a communication frame in the asynchronous wireless communication performed between the master BMS and a plurality of direct BMSs according to one embodiment of the present invention.

FIG. 11 schematically illustrates a structure of a communication frame in the asynchronous wireless communication performed between the master BMS 20000 and the plurality of direct BMSs 10000 according to one embodiment of the present invention.

As illustrated in FIG. 11, a communication frame of a wireless communication channel, through which the plurality of direct BMSs transmit and receive data to and from the master BMS 20000, includes a sub-frame including a downlink frame broadcasted by the master BMS 20000 to the plurality of direct BMSs 10000; and a plurality of uplink frames transmitted by each of the plurality of direct BMSs 10000 to the master BMS 20000, in which the downlink frame and the plurality of uplink frames in the sub-frame are temporally divided.

In addition, the data received by the plurality of direct BMSs 10000 through the downlink frame includes: identifier information of each of the direct BMSs 10000; and time division information of an uplink frame related to the direct BMS 10000 having the identifier information, and each of the direct BMSs 10000 transmits the data to the master BMS 20000 through the uplink frame allocated thereto, based on the time division information about its own the uplink frame included in the data received from the downlink frame.

Further, the wireless communication channel has a plurality of uplink frames that are temporarily configured following the downlink frame according to a predetermined rule, the data broadcasted in the downlink frame includes request information about a target to be transmitted by each of the direct BMSs 10000, and each of the direct BMSs 10000 generates response information according to the request information included in the data broadcasted in the downlink frame to transmit the data including the response information to the master BMS 20000 according to the time division information of its own uplink frame.

Further, the communication frame of the wireless communication channel includes a plurality of identical sub-frames, and the master BMS 20000 finally determines data to be received based on the received plurality of identical uplink frames.

Specifically, in one embodiment of the present information, a communication frame (=1 frame), which corresponds to a wireless communication period between the direct BMS 10000 and the master BMS 20000, may be set to a length of 100 ms. In a typical vehicle, a data transmission/reception period corresponds to 100 ms, and a response time of several sensor nodes connected to the direct BMS 10000 has a period of 100 ms, and thus it is most preferable to set 100 ms as a length of the communication frame, and accordingly, a state of each of the plurality of battery cells may be determined most quickly.

Meanwhile, as illustrated in FIG. 11, by performing repeated communication four times during one communication frame, it is possible to respond to a communication error and enhance communication stability, and the period of the repeated communication is defined as a sub-frame. The sub-frame includes a downlink frame to which communication (downlink communication) from the master BMS 20000 to the direct BMS 10000 is allocated and an uplink frame to which communication (uplink communication) from the direct BMS 10000 to the master BMS 20000 is allocated.

The downlink frame corresponds to a time allocated for the master BMS 20000 to broadcast to the plurality of direct BMSs 10000, and the signal broadcasted by the master BMS 20000 in the downlink frame includes identifier information of each of the plurality of direct BMSs 10000 and time division information of the uplink frame related to the direct BMS 10000 having the corresponding identifier information.

For example, the data, which is broadcasted by the master BMS 20000 in the downlink frame, includes information including: a first time according to identifier information of the direct BMS #1 10000.1 and identifier information of the direct BMS #1 10000.1; and a second time according to identifier information of the direct BMS #2 10000.2 and identifier information of the direct BMS #2 10000.2. The direct BMS #1 10000.1, which receives the data broadcasted by the master BMS 20000, transmits data about a battery module connected to itself (the direct BMS #1 10000.1) at the first time, and the direct BMS #2 10000.2 transmits data about a battery module connected to itself (the direct BMS #2 10000.2) at the second time. Meanwhile, the data broadcasted by the master BMS 20000 may further include identifier information of each of the direct BMSs 10000 and request information, command information, or control information according to the identifier information, and the direct BMS 10000 receiving the data may generate response information corresponding to the received request information, command information, or control information to transmit the response information to the master BMS 20000.

Meanwhile, the number of sub-frames included in one communication frame, a period of a sub-frame, a period of an uplink frame, a period of a downlink frame, and the like illustrated in FIG. 11 correspond to one embodiment of the present invention, and correspond to a matter that is changeable at any time according to the intention of the designer.

Additionally, a communication frequency channel for communication between the direct BMS 10000 and the master BMS 20000 includes a plurality of narrow band channels divided at intervals of 200 KHz in the 900 MHz band. Referring to the description of FIG. 5, when the wireless communication is performed by using the modulation/demodulation scheme of the present invention, the wireless communication system of the present invention has a simple structure and uses a narrow bandwidth compared to a wireless communication system using other modulation/demodulation schemes, and thus, the wireless communication system may perform optimized wireless communication in a harsh environment with a limited space and a limited weight, like a battery for a vehicle. In addition, in one embodiment of the present invention, the wireless communication system of the present invention may use several tens of 200 kHz narrow band channels due to good frequency efficiency, and thus may implement one-to-many communication such as communication of the master BMS 20000-the direct BMS 10000 in a small bandwidth.

In one embodiment of the present invention, as illustrated in FIG. 11, when a total of 25 direct BMSs 10000 are present, one sub-frame includes one downlink frame and 25 uplink frames. In this case, it is preferable that one uplink frame is allocated to each of the plurality of direct BMSs 10000 and is allocated to different time slots. That is, information about a time slot to which each of the plurality of uplink frames is allocated is defined as time division information.

In addition, when a total of four repeated communications are performed for one communication frame, one communication frame (=100 ms) includes four sub-frames (=25 ms*4=100 ms), and one sub-frame (=25 ms) includes one downlink frame (=ms) and a total of 25 uplink frames (=0.8 ms*25=20 ms).

In brief, the wireless communication system employed in the present invention corresponds to a system in which when the master BMS 20000 simultaneously transmits a message to the plurality of direct BMSs 10000, each of the plurality of direct BMSs 10000 receiving the corresponding message transmits data to the master BMS 20000 according to an uplink frame allocated thereto. A wireless communication system used in a conventional battery diagnosis technology includes many uplink communications, and thus a communication frame is configured based on the uplink frame, but the present invention adopts a structure in which the downlink frame is placed at the forefront of the communication frame, thereby securing reliability of data transmission and reception at an early stage and more efficiently utilizing the communication band.

In addition, the wireless communication system employed in the present invention is a system optimized for the size of data required for real-time transmission and reception of battery information and the number of nodes in a vehicle using electric power of the battery as power, so that it is possible to quickly and accurately provide a user with information about the battery of the vehicle even when the vehicle is stopped or is being charged or traveled.

Additionally, according to one embodiment of the present invention, by implementing the above-described communication system of the present invention in the descriptions of FIGS. 6, 10, and 11, any type of relay BMS that relays or collects information about a plurality of battery cells connected to each of the plurality of direct BMSs between the master BMS and the plurality of direct BMSs and transmits the information to the master BMS, may not be required.

According to one embodiment of the present invention, the current of the battery module may be measured through the current measurement port that is directly connected to the battery module, and the current for each battery module may be measured in the battery pack including the plurality of battery modules, thereby deriving more accurate battery diagnosis information.

According to one embodiment of the present invention, the direct BMS is configured to physically and electrically come into direct contact with the battery cells, thereby measuring the voltage and the current for the battery cells, so that noise generated due to channel switching can be prevented in the related art in which the battery and the direct BMS are indirectly connected through a cable or the like, and accordingly, the reliability of data measured for the battery cells can be increased.

According to one embodiment of the present invention, the system is designed based on of individual cells and power to be supplied when a state of the battery is sensed, and the system may thus be operated at a relatively low voltage, thereby using a substrate implemented by the LDCMOS process rather than the conventional BCD process, and accordingly, it is possible to improve sensing accuracy for a battery.

According to one embodiment of the present invention, a configuration is adopted in which the first substrate unit which may measure the voltage, current, and temperature for the plurality of battery cells and is implemented by the LDCMOS process, and the second substrate unit which may wirelessly transmit information measured by the first substrate unit to the master BMS are implemented by different processes, and the first substrate unit and the second substrate unit are combined into one system semiconductor through an MCP method, so that it is possible to reduce manufacturing costs.

According to one embodiment of the present invention, the ADC is included in the second substrate unit, not the first substrate unit implemented by the LDCMOS process, so that it is possible to maximize performance thereof while minimizing the size of the ADC.

According to one embodiment of the present invention, the battery module and the direct BMS are physically directly connected without a separate component such as a cable, so that durability against vibration can be improved compared to the conventional vehicle battery management systems, and accordingly, reliability of measured data can be increased even in the special measurement situations such as high-speed driving environments.

According to one embodiment of the present invention, any type of relay BMS that relays or collects information about a plurality of battery cells connected to each of the plurality of direct BMSs between the master BMS and the plurality of direct BMSs and transmits the information to the master BMS, may not be required.

Although the above embodiments have been described with reference to the limited embodiments and drawings, however, it will be understood by those skilled in the art that various changes and modifications may be made from the above-mentioned description For example, even though the described descriptions may be performed in an order different from the described manner, and/or the described components such as system, structure, device, and circuit may be coupled or combined in a form different from the described manner, or replaced or substituted by other components or equivalents, appropriate results may be achieved.

Therefore, other implementations, other embodiments, and equivalents to the claims are also within the scope of the following claims.

What is claimed is:

1. A system for diagnosing a battery cell located inside a vehicle, the system comprising:
a plurality of direct battery management systems (BMSs) located inside the vehicle and electrically connected to a plurality of battery cells included in a battery module; and
a master battery management system (BMS) located inside the vehicle and configured to wirelessly communicate with the direct BMSs,
wherein the direct BMS includes:
a first substrate unit; and a second substrate unit,
wherein the first substrate unit includes:
a battery cell connection unit including a plurality of ports that physically and electrically come into direct contact with an exposed electrode of each of the plurality of battery cells;
a multiplexer (MUX) unit configured to receive analog voltage signals of the plurality of ports of the battery cell connection unit and sequentially output any one of the analogue voltage signals;
a voltage dropping unit configured to drop the analog voltage signal output from the MUX unit;
a current measurement unit configured to measure a current for all of the plurality of battery cells to generate an analog current signal;
a temperature measurement unit configured to generate an analog temperature signal; and
a first substrate connection unit configured to receive the analog voltage signal, the analog current signal, and the analog temperature signal to output the analog voltage signal, the analog current signal, and the analog temperature signal to the second substrate unit; and
wherein the second substrate unit including a substrate and an element, both operable within a second power range of 5 V or less, converts the received analog voltage signal, analog current signal, and analog temperature signal into digital signals to wirelessly transmit the digital signals to the master BMS;
wherein the first substrate unit includes a substrate and an element, each manufactured with a laterally diffused complementary metal oxide semiconductor (LD-CMOS) process and operable within a first power range of 36 V or less, and a level shifter configured to receive power from all of the plurality of battery cells, adjust a level of the received power to a predetermined level or less, and transmit the power with the adjusted voltage to a signal transmission unit and a regulator within the first substrate unit; and
wherein the first substrate unit and the second substrate unit are stacked on a single semiconductor chip by a multi-chip package (MCP) process.

2. The system of claim 1, wherein both a positive electrode terminal and a negative electrode terminal of each of the plurality of battery cells come into direct contact with the ports included in the battery cell connection unit, and
the voltage measurement unit is connected to each port to measure a voltage for each of the battery cells.

3. The system of claim 1, wherein the battery cell connection unit includes a current measurement port including a resistor, and
the current measurement unit measures a current of the battery module based on a result of amplifying a voltage difference between both ends of the resistor, and an amplifier for amplifying the voltage difference adjusts an amplification rate by an automatic gain control unit.

4. The system of claim 1, wherein the second substrate unit includes:
a microcontroller unit (MCU);
a first wireless communication unit connected to the MCU to wirelessly communicate with the master BMS; and
a power supply unit configured to supply power to an element inside the second substrate unit by receiving power from the first substrate unit while lowering a voltage of power of the plurality of battery cells.

5. The system of claim 4, wherein the first wireless communication unit includes:
a modem unit including a modem transmission unit configured to perform modulation for transmitting information received from the MCU to the master BMS, and a modem reception unit configured to perform demodulation for transmitting the signal received from the master BMS to the MCU; and
a transceiver unit including a Tx unit including a configuration to broadcast the signal modulated by the modem transmission unit through a first antenna unit, and an Rx unit including a configuration to process the signal received through the first antenna unit.

* * * * *